(12) United States Patent
Harju et al.

(10) Patent No.: US 6,522,214 B1
(45) Date of Patent: Feb. 18, 2003

(54) ELECTRICAL TRANSMISSION LINE ARRANGEMENT WITH A CROSS-OVER

(75) Inventors: Thomas Harju, Sävedalen (SE); Björn Albinsson, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/597,989

(22) Filed: Jun. 19, 2000

(30) Foreign Application Priority Data

Jun. 17, 1999 (SE) ................................. 9902296

(51) Int. Cl.$^7$ .................................. H01P 3/08
(52) U.S. Cl. ............................. 333/1; 333/246
(58) Field of Search ................... 333/1, 238, 246; 174/264

(56) References Cited

U.S. PATENT DOCUMENTS

| | | | | |
|---|---|---|---|---|
| 5,117,207 A | * | 5/1992 | Powell et al. | 333/1 |
| 5,432,485 A | | 7/1995 | Nagashima | 333/1 |
| 5,600,285 A | | 2/1997 | Sachs et al. | 333/1 |
| 6,097,260 A | * | 8/2000 | Whybrew et al. | 333/246 X |

FOREIGN PATENT DOCUMENTS

| | | |
|---|---|---|
| EP | 0 858 251 A1 | 8/1998 |
| FR | 2625373 A1 | 6/1989 |

* cited by examiner

*Primary Examiner*—Benny Lee
(74) *Attorney, Agent, or Firm*—Nixon & Vanderhye, PC

(57) ABSTRACT

The invention relates to an electrical transmission arrangement comprising a first strip-line conductor which has its main extension in a first direction in a first plane in the transmission arrangement and comprises a conductor, an upper ground plane which is situated at an upper distance from the conductor and a lower ground plane which is situated at a lower distance from the conductor, and a second strip-line conductor which has its main extension in a second direction in a second plane in the transmission arrangement and comprises a conductor, an upper ground plane which is situated at an upper distance from the conductor and a lower ground plane which is situated at a lower distance from the conductor, where the ground planes are separated from their respective conductors and from one another by a dielectric material, in which transmission arrangement the lower ground plane of the first strip-line conductors coincides with the upper ground plane of the second strip-line conductors at at least one point. At the point, where the lower ground plane of the first strip-line conductor coincides with the upper ground plane of the second strip-line conductor, the main direction of extension of the first strip-line conductor crosses the main direction of extension of the second strip-line conductor, and the second strip-line conductor extends in a third plane in the transmission arrangement at this crossing point, whereby the second strip-line conductors exhibit electrical connections between adjacent planes, which connections connect the conductors of the second strip-line conductor, upper ground planes and lower ground planes to corresponding components in adjacent planes.

6 Claims, 6 Drawing Sheets

ELECTRICAL TRANSMISSION LINE ARRANGEMENT WITH A CROSS-OVER

TECHNICAL FIELD

The present invention relates to an electrical transmission arrangement for use preferably within the microwave band in association with strip-line conductors. The invention is primarily intended for applications where there is need to transfer electrical signals in strip-line conductors in crossing directions.

PRIOR ART

When transferring electrical signals in the microwave band, primarily in transmission arrangements such as circuit cards and in antenna applications, strip-line conductors are normally used. A strip-line conductor comprises a normally flat conductor and an upper and lower associated ground plane, where the ground planes are separated from the conductor by a dielectric material. The ground planes are also normally flat and arranged mainly in parallel with the conductor at an essentially constant distance from the latter.

A strip-line conductor normally has its main extension in the transmission arrangement in the direction in which it is desired to transfer signals. If it is found to be desirable to transfer signals in strip-line conductors in two different directions, problems can, therefore, occur if these directions cross one another since the strip-line conductors will then run into each other if one of the components included in one strip-line conductor is located in a same plane as a component from the second strip-line conductor.

One way of allowing two strip-line conductors to cross the directions of extension of each other without the strip-line conductors running into each other is to arrange the two strip-line conductors on separate planes in the transmission arrangement. However, this would lead to a solution which requires much space in the transmission arrangement. Furthermore, such a solution would provide poor insulation between the two strip-line conductors since the requirement for saving space in the circuit card would lead to the strip-line conductors being placed as close to one another as possible, with interference between the conductors on both sides as a consequence.

SUMMARY OF THE INVENTION

The problem solved by the present invention is to allow two strip-line conductors to cross one another in their main directions of extension with high insulation and in a relatively little space in an electrical transmission arrangement such as a circuit card or an antenna arrangement.

This problem is solved with the aid of an electrical transmission arrangement comprising a first strip-line conductor which has its main extension in a first direction in a first plane in the transmission arrangement and comprises a conductor, an upper ground plane which is situated at an upper distance from the conductor and a lower ground plane which is situated at a lower distance from the conductor. The transmission arrangement also comprises a second strip-line conductor which has its main extension in a second direction in a second plane in the transmission arrangement and comprises a conductor, an upper ground plane which is situated at an upper distance from the conductor and a lower ground plane which is situated at a lower distance from the conductor. The ground planes in both strip-line conductors are separated from their respective conductors and from one another by a dielectric material.

At at least one point in the transmission arrangement, the lower ground plane of the first strip-line conductor coincides with the upper ground plane of the second strip-line conductor.

At the point where the lower ground plane of the first strip-line conductor coincides with the upper ground plane of the second strip-line conductor, the main direction of extension of the first strip-line conductor crosses the main direction of extension of the second strip-line conductor. The second strip-line conductor extends in a third plane in the transmission arrangement at this crossing point whereby the second strip-line conductor exhibits electrical connections between adjacent planes, which connections connect the conductors of the second strip-line conductor, the upper ground plane and the lower ground plane to corresponding components in adjacent planes.

To further reduce the losses at the crossing point, it may be advantageous to allow the second strip-line conductor in a transmission arrangement of the type described above to have a part of its extension in yet another plane, a fourth plane, where the extension in the fourth plane is situated between the extensions of the second strip-line conductor in the second and the third plane. In this embodiment, the said electrical connections between adjacent planes, of the second strip-line conductor, constitute connections between the second and the fourth plane and connections between the third and the fourth plane, which connections connect the conductors of the second strip-line conductor, upper ground plane and lower ground plane in the second and, respectively third plane to the corresponding components of the second strip-line conductors in the fourth plane.

An alternative way of allowing two strip-line conductors to cross each other's main direction of extension in a space-saving manner and with high insulation in an electrical transmission arrangement is to allow the arrangement, in the same way as has been described above, to comprise a first strip-line conductor which has its main extension in a first direction in a first plane in the transmission arrangement, to comprise a conductor, an upper ground plane which is situated at an upper distance from the conductor and a lower ground plane which is situated at a lower distance from the conductor. Such an arrangement also comprises a second strip-line conductor which has its main extension in a second direction in a second plane in the transmission arrangement and comprises a conductor, an upper ground plane which is situated at an upper distance from the conductor and a lower ground plane which is situated at a lower distance from the conductor, where the ground planes are separated from their respective conductors and from one another by a dielectric material.

In this embodiment of the invention, the main direction of extension of the first strip-line conductor crosses the main direction of extension of the second strip-line conductor at at least one point, but in contrast to the embodiments which have been described above, the first strip-line conductor extends in a third plane in the transmission arrangement at the crossing point, and the second strip-line conductor extends in a fourth plane in the transmission arrangement. The first strip-line conductor exhibits electrical connections between the first and the third plane, and the second strip-line conductor exhibits electrical connections between the second and the fourth plane, where the connections connect the conductor of the first strip-line conductor, upper ground planes and lower ground planes in the first plane to the corresponding components in the third plane, and the conductor of the second strip-line conductor, upper ground plane and lower ground plane in the second plane to the corresponding components in the fourth plane.

In contrast to the two embodiments of the invention described in the introduction, the third and the fourth plane in this embodiment are situated in the transmission arrangement in such a manner that the perpendicular distance between the lower ground plane of the first strip-line conductor and the upper ground plane of the second strip-line conductor increases at the crossing point, instead of these two ground plane coinciding at the crossing point.

To further reduce the power losses in a transmission arrangement according to the invention, ground planes and conductors should be constructed in such a manner that all points on the conductor essentially exhibit the same capacitance with respect to the ground planes. This is suitably brought about by the connections between different planes of the conductor of a strip-line conductor passing an edge in a ground plane, which edge is constructed for impedance matching. In a preferred embodiment of the invention, this construction gives an elliptical shape to at least a part of the edge.

BRIEF DESCRIPTION OF THE FIGURES

The invention will be described in greater detail below with the aid of examples of embodiments and with reference to the attached drawings, where like reference labels refer to like elements throughout the drawings, in which.

DETAILED DESCRIPTION OF THE PREFERRED EMBODIMENTS

Figure 1:
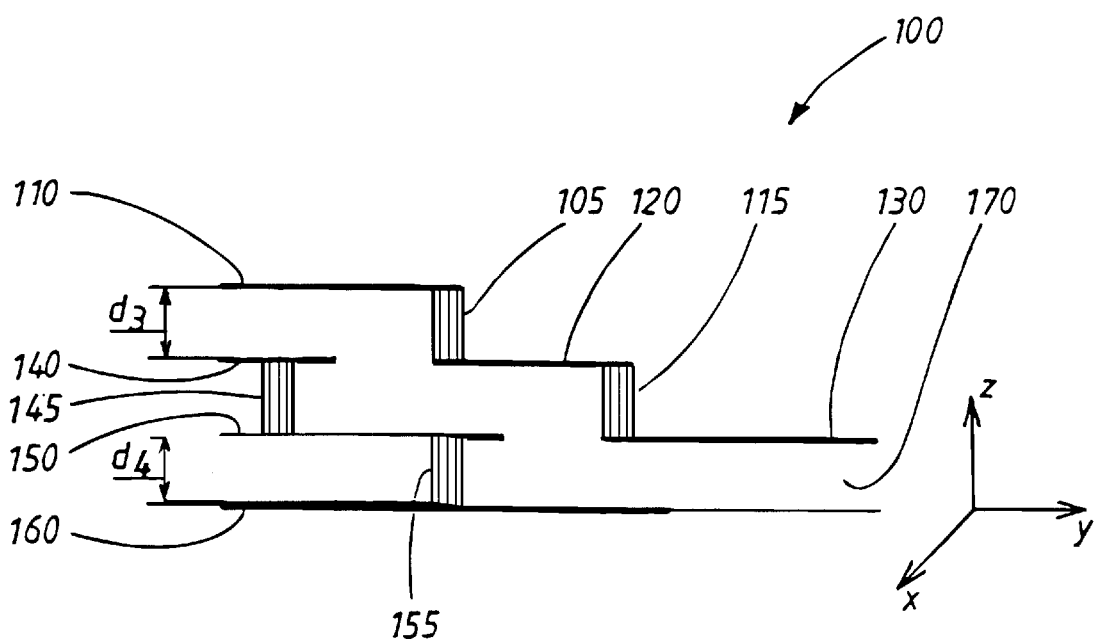
FIG. 1 shows a cross section from one side of a microstrip arrangement according to the invention.

FIG. 1 shows a cross section from the side of a transmission arrangement 100 according to the invention, mainly intended for microstrip applications. To facilitate the understanding of the description of the invention, a three-dimensional orthogonal Cartesian coordinate system (x,y,z) has been drawn in connection with FIG. 1.

As can be seen from FIG. 1, the arrangement 100 comprises a first conductor section 110, a second conductor section 120 and a third conductor section 130. All conductor sections are flat and, in other words, have their main extensions in two planes (x,y). As can also be seen from FIG. 1, the conductor sections are situated in different layers in a dielectric substrate 170 and are arranged in such a manner, that the first conductor section 110 is displaced in parallel with respect to the second conductor section 120, and the second conductor section 120 is displaced in parallel with respect to the third conductor section 130.

For the sake of clarity, it can be said that the progressive parallel displacements of the conductor sections occur in a direction (z) which is at right angles to the two planes (x,y) which define the main extensions of the conductor sections.

Apart from the fact that the conductor sections are displaced in parallel with respect to one another in the manner which has been described above, the conductor sections are suitably progressively displaced with respect to one another in another direction which coincides with one of the two planes (y) which define the main extensions of the conductor section. In other words, the second conductor section is displaced in parallel with respect to the first conductor section and is also displaced in that direction (y), which also applies to the third conductor section displaced with respect to the second.

The invention can be extended with an arbitrary number of conductor sections and it should only be considered as an example that the number of conductor sections in the drawing is three. The principle, described above, of how the conductor sections are arranged with respect to one another should, however, be applied throughout the arrangement regardless of the number of conductor sections.

The arrangement 100 also comprises a first, a second and a third ground plane sections, 140, 150, and 160, respectively, which are separated from the conductor sections and from one another by the dielectric material 170. Like the conductor sections, the ground plane sections are also essentially flat and have their main extensions in the same two planes (x,y) as the conductor sections 110, 120, 130.

The first ground plane section 140 essentially extends in parallel with the first conductor section 110 on the first side of this conductor section at a certain distance ($d_3$) from the latter, the second ground plane section 150 is displaced in parallel with respect to the first ground plane section 140, and the third ground plane section 160 is likewise displaced in parallel with respect to the second ground plane section 140.

For the sake of clarity, it can be pointed out here that the parallel displacement of the ground plane sections occurs in the same direction as the parallel displacement of the conductor sections, in other words, a direction (z) which is at right angles to the two planes (x,y) which define the main extensions of the conductor sections and the ground plane sections.

Like the conductor sections, the ground plane sections are suitably also progressively displaced with respect to one another in a direction (y) which coincides with one of the two planes (x,y) which define the main extensions of the ground plane sections. In other words, the second ground plane section is displaced in parallel (z) with respect to the first ground plane section and also displaced in the direction (y), which also applies to the third ground plane section with respect to the second ground plane section.

Displacement of the ground plane sections with respect to one another in a direction (y) which coincides with one of the two planes (x,y) which define the main extensions of the ground plane sections can be suitably done in a way which is shown in FIG. 1, which means that each ground plane section is made longer than one of the closest ground planes, which has a result that the displacement arises by a part of each ground plane extending past the edge of one of the closest ground planes. In other words, in practice, a stepped formation of ground plane sections is formed.

In a variant of the invention which is shown in FIG. 1, the ground plane sections are constructed in such a manner that they only have different lengths in the direction (y) in which they will be progressively displaced with respect to one another.

The invention can be extended with an arbitrary number of ground plane sections and it should only be considered as an example that the number of ground plane sections in FIG. 1 is three. The principle, described above, of how the ground plane sections are arranged with respect to one another should, however, be applied for the arrangement regardless of the number of ground plane sections. However, the arrangement suitably has the same number of ground plane sections as the number of conductor sections in the embodiment which is intended for microstrip applications.

The first ground plane section 140 extends essentially parallel with the first conductor section 110, and since the ground plane sections and conductor sections are mutually displaced in parallel and also progressively displaced in another direction (y), the result is that the second ground plane section 150 will be essentially in parallel with the second conductor section 120, a relationship which also applies to the third ground plane section 160 with respect to the third conductor section 130.

The distance between the second conductor section 120 and the second ground plane section 150 is suitably the same as the distance ($d_3$) between the first conductor section 110 and the first ground plane section 140, which also applies to the distance between the third conductor section 130 and the third ground plane section 160. The principle of equal distances between a conductor section and its closest ground plane section is suitably observed regardless of how many conductor sections and corresponding ground plane sections are included in the arrangement. For the sake of clarity, it can be pointed out here, that the closest ground plane section means the one which is closest in the direction which at right angles to the two planes (x,y) which define the main extensions of the conductor sections and the ground plane sections.

The distance $d_4$ between the second and the third ground plane section is suitably also the same between two adjacent ground plane sections in the whole arrangement.

Every one of the conductor sections 110, 120, 130 is electrically connected to the closest of the second conductor sections and every one of the ground plane sections 110, 120, 130 is electrically connected to the closest of the second ground plane sections. The connections 105, 115 between the conductor sections and the connections 145, 155 between the ground plane sections are suitably constructed of so-called through-holes, in other words holes which are made in the dielectric material 170 which separates the conductor sections and, respectively, ground plane sections from one another, after which the holes are metallized completely or partially which makes the through-holes electrically conducting. The more detailed construction and placing of the connections between the ground planes and between the conductor sections will be described in detail below in connection with FIGS. 2, 3 and 5.

Figure 2:
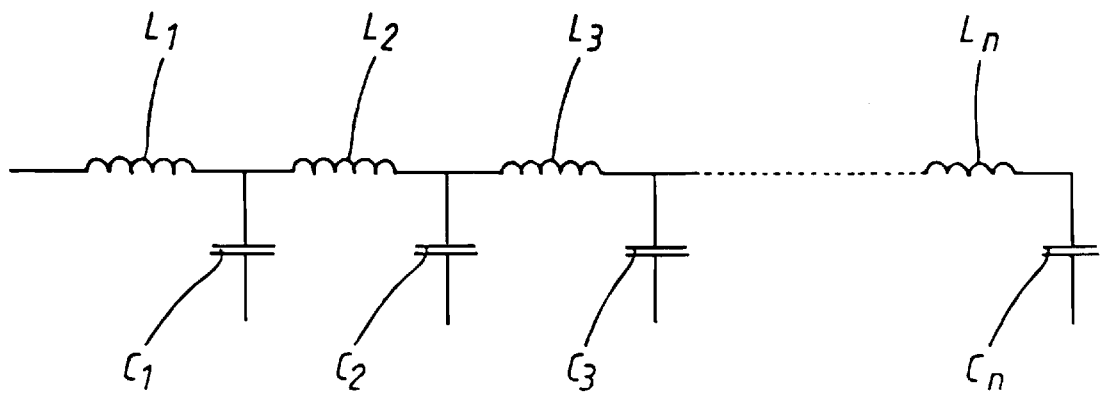
FIG. 2 shows an equivalent circuit diagram for and arrangement according to the invention.

FIG. 2 shows an equivalent circuit diagram for a microstrip arrangement or strip-line arrangement. As can be seen, from FIG. 2, the equivalent circuit diagram is made up of a number of inductances L1, L2, L3 . . . Ln and a corresponding number of capacitances, C1, C2, C3 . . . Cn. The magnitude of the inductances and capacitances in a conventional microstrip arrangement or strip-line arrangement depends to a large extent on the distance/distances between the conductors and the ground planes of the arrangement, and on the width of the conductors and the ground planes. A conventional microstrip arrangement or strip-line arrangement is thus constructed to provide a certain required impedance.

It is desirable, that an arrangement according to the invention provides the lowest possible power losses, with the result, that the arrangement should be constructed in such a manner that it exhibits the same impedance as the surrounding microstrip arrangement or strip-line arrangement in which it will be used. To obtain this result, the ground plane sections and conductor sections in the arrangement should be constructed in such a manner that all points on all conductor sections exhibit essentially the same capacitance with respect to the ground plane. This impedance matching of the arrangement according to the invention is produced not only by influencing the width of the conductors and the ground planes and the distance between the conductors and the ground planes but also by the construction of the connections 145, 155 between the different ground plane sections and of the connections between the different conductor sections 105, 115 which will be described below.

Figure 3:
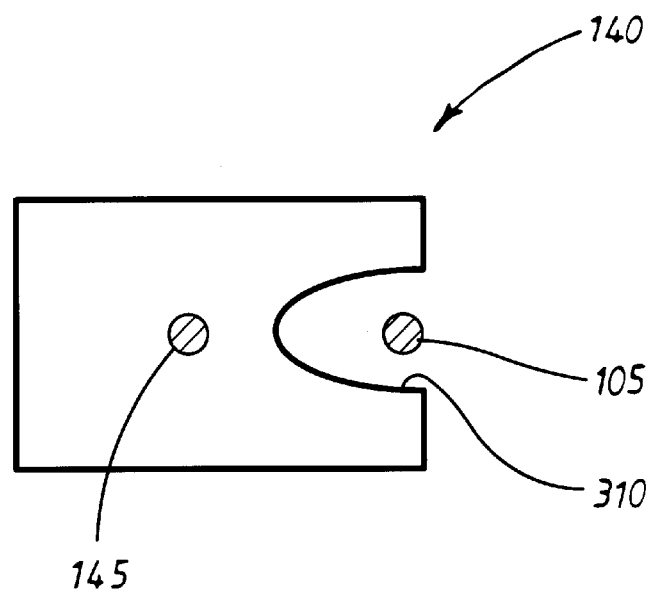
FIG. 3 shows a ground plane according to the invention, seen from above.

FIG. 3 shows an example of how a ground plane section for use in an arrangement according to the invention can be constructed, for example the ground plane section 140. However, the principles which will be described for the construction of the ground plane section 140 also apply to all ground plane sections in an arrangement according to the invention intended for microstrip applications.

The ground plane section 140 is shown "from above" in FIG. 3, in other words, from the direction (z) in which the different conductor sections and ground plane sections are displaced in parallel with respect to one another. The drawing also shows the connection 145 between the ground plane 140 and "next" ground plane 150, and the connection 105 between the first conductor section 110 and the second conductor section 120. The principles which will be described here for how the connections between two conductor sections are placed with respect to a ground plane section are also generally applicable for an arrangement according to the invention intended for microstrip applications.

As can be seen from FIG. 1 and FIG. 3, the connection 105 between the two conductor sections 110 and 120 passes an edge 310 in the first round plane section 140. Since the impedance of the arrangement 100 is affected by the distance between the conductor sections and the ground planes, the edge 310 of the ground plane section and the distance between the edge 310 and the connection 105 between two conductor sections should be constructed in such a manner, that the impedance of the arrangement becomes as insensitive as possible to variations which can arise during manufacture. To achieve this, the total impedance between the edge 310 and the connection 105 should be spread as uniformly as possible. An advantageous way of achieving this is to construct a part of the edge 310 as a part of an imagined ellipse, the connection 105 being placed essentially in the centre point of the imaged ellipse.

FIG. 3 also shows the connection 145 which connects the first ground plane 140 with the second ground plane section 150. To achieve the required impedance matching in an arrangement according to the invention, the distance $d_2$ between the connection, through-hole 145 and the edge 310 on the ground plane section which the connection between two conductor sections passes should be of such magnitude, that the capacitance coupling between the conductor connection 105 and the edges of the parts of the ground plane section 140 which are closest to the connection 145, which parts are made up of the edges of the ellipse in the present case, dominates over the capacitance coupling which is produced between the ground plane connection 145 and conductor connection 105.

Figure 4:
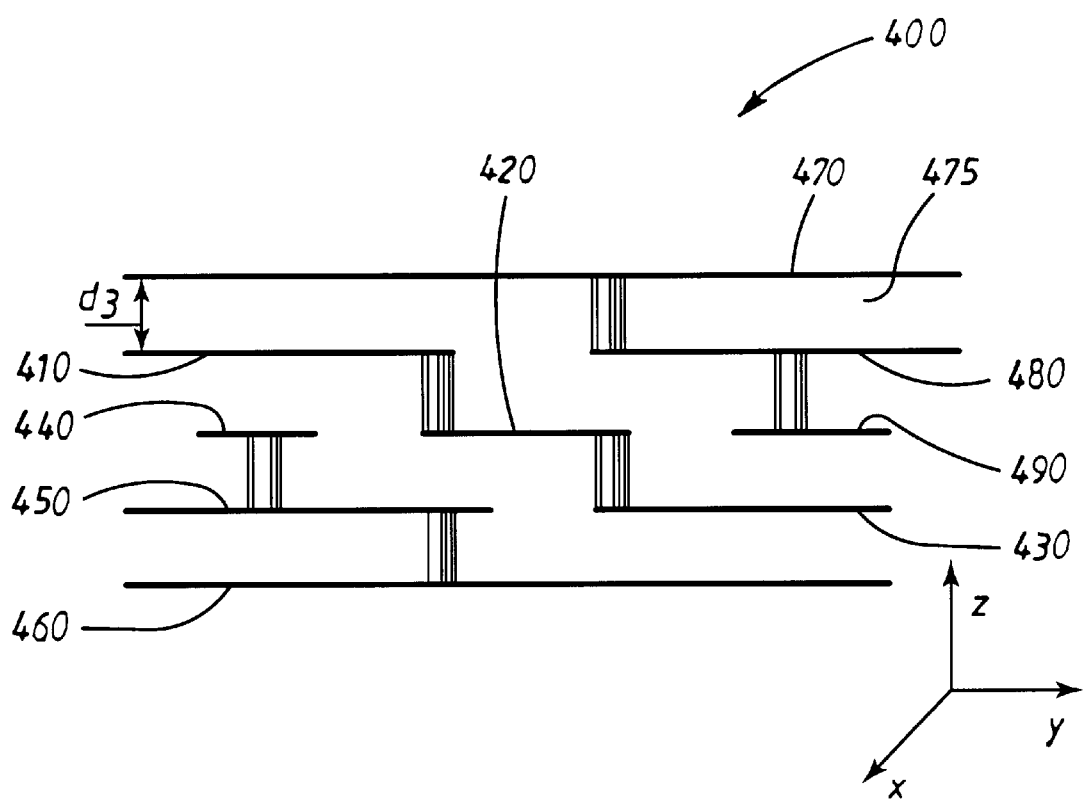
FIG. 4 shows a cross section from one side of a strip-line arrangement according to the invention.

FIG. 4 shows a cross section from the side of an arrangement 400 according to the invention, intended for strip-line applications. The conductor sections in arrangement 400 in FIG. 4 correspond to the conductor sections in the variant 100 of the arrangement which is intended for microstrip applications, but since the strip-line technology comprises a conductor with two ground planes, one on each side of the conductor, the arrangement 400 according to the invention should comprise at least another ground plane section 470 situated on the other side of one of the conductor sections 410. The ground plane section 470 cooperates with the closest ground plane section 440 on the first side of the conductor section to form an arrangement according to the strip-line principle. The second ground plane section 470 is suitably situated at the same distance $d_3$ from the second side of the conductor section 410 as the ground plane section 440 on the first side of the conductor section 410, with which it is cooperating.

In a preferred embodiment, an arrangement according to the invention, which will be used in strip-line applications, comprises ground plane sections on the first and the second side of all conductor sections in the arrangement. For the arrangement shown in FIG. 4, this means that the arrangement 400 on the other side of the conductor section 410, 420, 430, apart from the abovementioned further ground plane sections 470, also comprises two further ground plane sections 480, 490, situated on this second side of the conductor section. These two further ground plane sections 480, 490 are also situated at the same distance $d_3$ from their respective conductor sections 420, 430 as the ground plane sections 450, 460 on the first side of the conductor section with which the ground plane section on the other side is cooperating. This principle of equal distances between cooperating ground plane sections on both sides of the conductor sections should be taken into consideration regardless of how many conductor sections and ground plane sections a strip-line arrangement according to the invention is provided with.

Every one of the ground plane sections 470, 480, 490 on the second side of the conductor sections in the variant of the invention which is intended for strip-line applications also corresponds to a ground plane section on the first side of the conductor section with regard to dimensioning, construction etc., in all essential respects. To facilitate the understanding of this principle, the following can be pointed out with reference to FIG. 4: the ground plane sections 470 and 440 together form a ground plane according to the strip-line principle for a part of the conductor section 410. However, it is the ground plane section 470 on the second side of the conductor sections with respect to construction and dimensioning in correspondence with the ground plane section 460 on the first side, since these two ground plane sections are those which are located "outermost" in the arrangement. This principle with respect to correspondence between two ground plane sections on both sides of the conductor sections should apply to all ground plane sections in an arrangement intended for strip-line applications.

Certainly, the ground plane sections 470, 480, 490 on the second side of the conductor sections are also separated from their corresponding conductor sections by a dielectric material 475 and, like the ground plane sections on the first side, each ground plane section on the second side is connected to the closest one of the second ground plane sections.

With the principles, described above, for placing and dimensioning the ground plane sections, the following can finally be described with respect to an arrangement according to the invention which is intended to be applied in association with strip-lines: the ground plane sections (470, 480, 490) on the said second side of the conductor sections are, like the ground plane sections on the first side of the conductor sections, progressively displaced with respect to one another in a direction y which coincides with one of the two planes x, y which define the main extensions of the ground plane sections. This displacement is suitably carried out in the same way as the displacement in the same direction of the ground plane sections on the first side of the conductor sections; each ground plane section is made longer than one of the closest ground planes which has a result that the displacements are produced by a part of each ground plane extending past the edge on one of the closest ground planes. In other words, in practice, a stepped formation of ground plane sections is formed.

In the variant of the invention which is shown in FIG. 4, the ground plane sections are constructed in such a manner that they only have different lengths in the direction y in which they will be progressively displaced with respect to one another. With respect to this difference in length, the ground plane sections 470, 480, 490 on the second side of the conductor sections can also suitably be given the same lengths as a corresponding ground plane section 460, 450, 430 on the first side.

In the variant of the invention which is intended for strip-line applications, each conductor section is also connected with one or more of the second conductor sections, suitably the closest ones, in the same way as has been described above in connection with FIG. 1. As can be seen from FIG. 4, the connections between two adjacent conductor sections pass at least one edge in a ground plane section on the said second side of a conductor section, which is why these edges should be constructed for impedance matching of the transmission arrangement.

The construction of the ground plane section which has been shown above in connection with a microstrip variant of the invention can be advantageously also applied to the variant of the invention which is intended to be used in association with strip-lines. The result is that the ground plane section which is shown in FIG. 3 and which has been described above can also be applied in association with strip-lines.

As can be seen from FIG. 4, at least one ground plane section 440 on the first side of the conductor sections will end up at the same "level" in the dielectric substrate 475 as one of the ground plane sections 490 on the second side in the arrangement 400. The result is that the two ground planes 440, 490, which are located at the same level, instead of being constructed as two separate sections with the appearance of the ground plane section 140 shown in FIG. 3, can be constructed as a coherent, disc with a recess in the centre through which recess the connection between two conductor sections goes.

Figure 5:
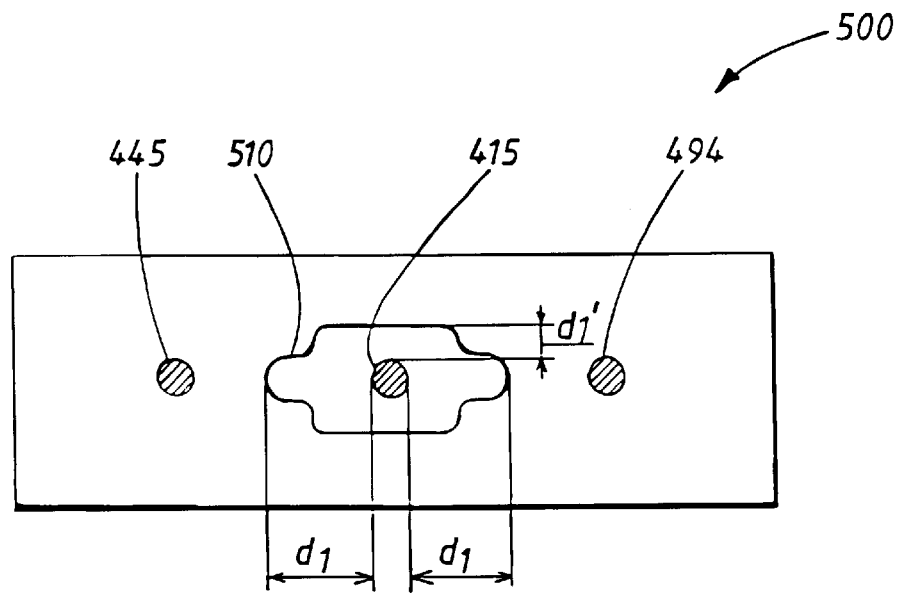
FIG. 5 shows an alternative ground plane according to the invention, seen from above.

Such a coherent disc 500 for use as ground plane section in an arrangement 400 according to the invention which is intended to be used for strip-line applications is shown in FIG. 5. FIG. 5 shows the recess in the disc, the connection 415 between two conductor sections 420, 430 which go through the recess in the disc, and two connections 445, 494, which connect the disc with the two closest ground plane sections 450, 480.

As can be seen from FIG. 5, the elliptical shape of the edge 510 is retained at the recess which is closest to the connections 445, 494 to other ground planes. The distance d2 between the ground plane connections 445, 494 and the edge is preferably the same and is suitably selected according to the principles which have been described for similar ground plane connections shown in association with FIG. 3.

The connection 415 between two conductor sections is suitably placed at the centre of the recess in a disc 500 which, due to the shape of the recess, has the result that the connection 415 will have a largest distance $d_1$ and a smallest distance $d_1'$ to the edge 510 of the recess.

Figure 6:
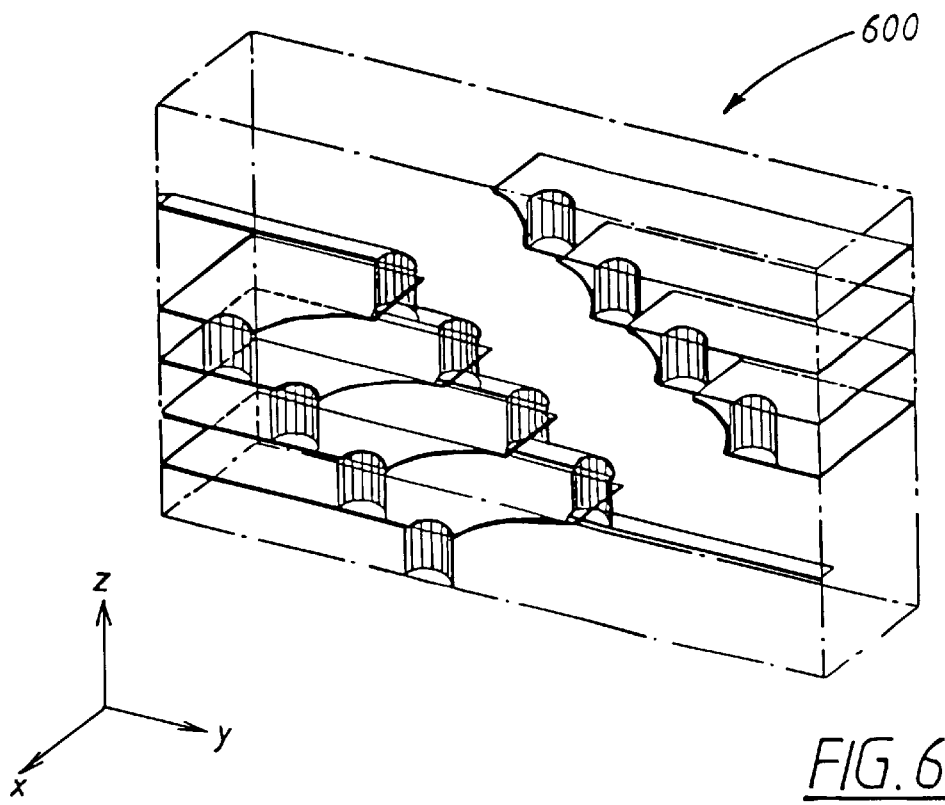
FIG. 6 shows a cross section in perspective of a strip-line arrangement according the invention.

FIG. 6 shows a cross section in perspective of an arrangement 600 according to the invention, intended for strip-line applications. FIG. 6 shows the stepped construction which the ground plane sections have on both sides of the conductor sections. Furthermore, FIG. 6 shows the connections between different ground plane sections and the connections between different conductor sections.

Figure 7:
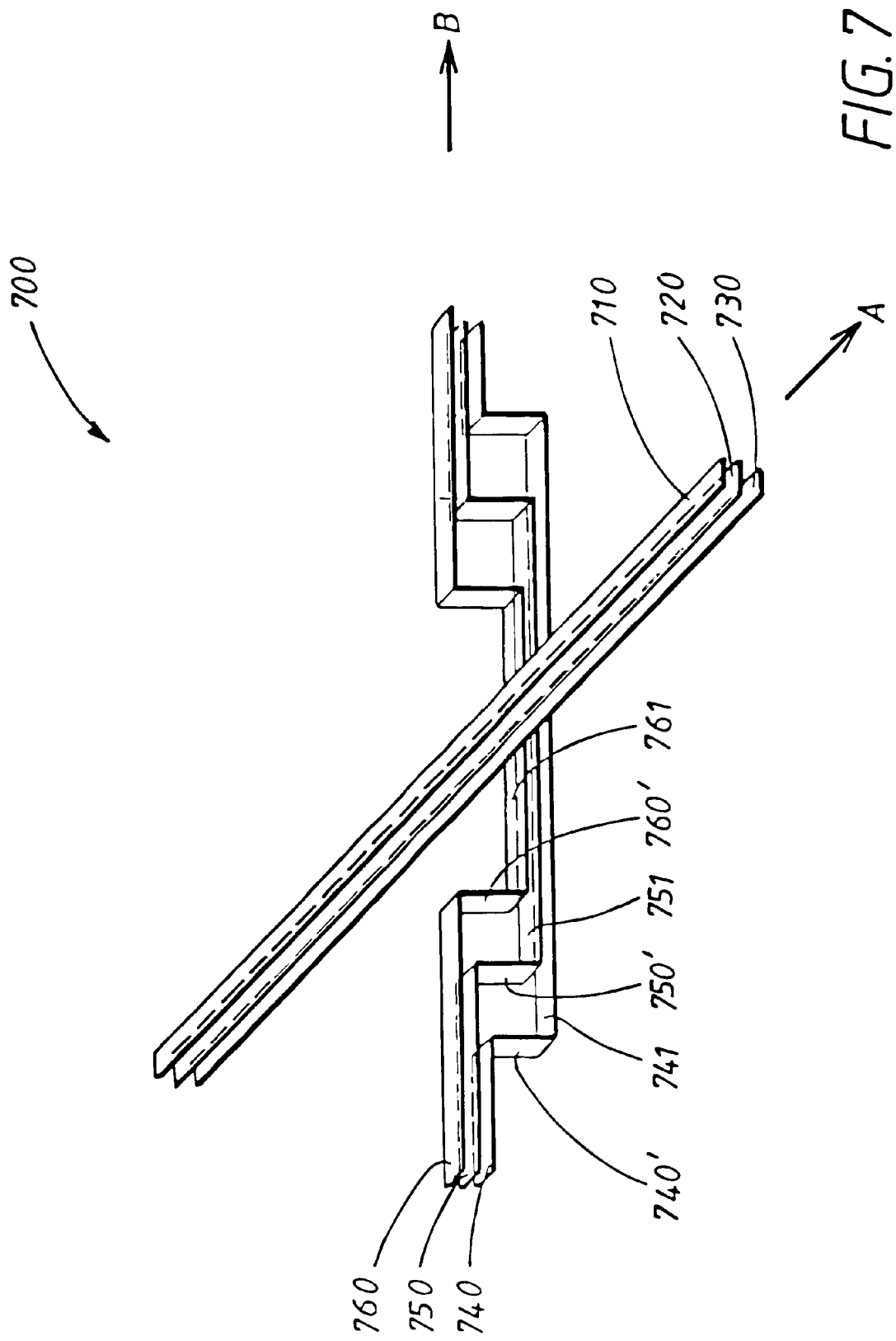
FIG. 7 shows an embodiment of the invention which is used for allowing two strip-line conductors to cross each other's direction of extension, and FIG. 8 also shows an embodiment of the invention which is used for allowing two strip-line conductors to cross the directions of extension of each other

FIG. 7 shows an example 700 of how the stepped construction of a strip-line conductor according to the invention can be used for allowing two strip-line conductors to cross one another in a space-saving manner with high insulation between the conductors. The transmission arrangement 700 comprises a first and a second strip-line conductor, where the first strip-line conductor has its main extension in a first direction A in a first plane in the transmission arrangement and comprises a conductor 720, an upper ground plane 710 which is situated at an upper distance from the conductor and a lower ground plane 730 which is situated at a lower distance from the conductor.

The transmission arrangement 700 also comprises a second strip-line conductor which has its main extension in a second direction B in a second plane in the transmission arrangement and comprises a conductor 750, an upper ground plane 760 which is situated at an upper distance from the conductor, and a lower ground plane 740 which is situated at a lower distance from the conductor.

The ground planes 710, 730; 760, 740 in the strip-line conductors are separated from their respective conductors 720, 750 and from one another by a dielectric material (not shown) in the transmission arrangement 700.

The lower ground plane 730 of the first strip-line conductor coincides with the upper ground plane 760 of the second strip-line conductor at at least one point. The required crossing between the strip-line conductors is achieved by the fact that, at the point where the lower plane 730 of the first strip-line conductor coincides with the upper ground plane 760 of the second strip-line conductor, the main direction of extension A of the first strip-line conductor crosses the main direction of extension B of the second strip-line conductor. The required compact structure and high insulation between the two strip-line conductors at the crossing is achieved by the fact that the second strip-line conductor extends in a third plane in the transmission arrangement at the crossing point, whereby the second stripline conductor exhibits electrical connections 740', 750', 760' between adjacent planes, the second and the third plane in the case shown. These connections 740', 750', 760' connect the conductor 750 of the second strip-line conductor, the upper ground plane 760 and lower ground plane 740 in the second plane to corresponding components 751, 761, 741 of the second strip-line conductor in the third plane.

Figure 8:
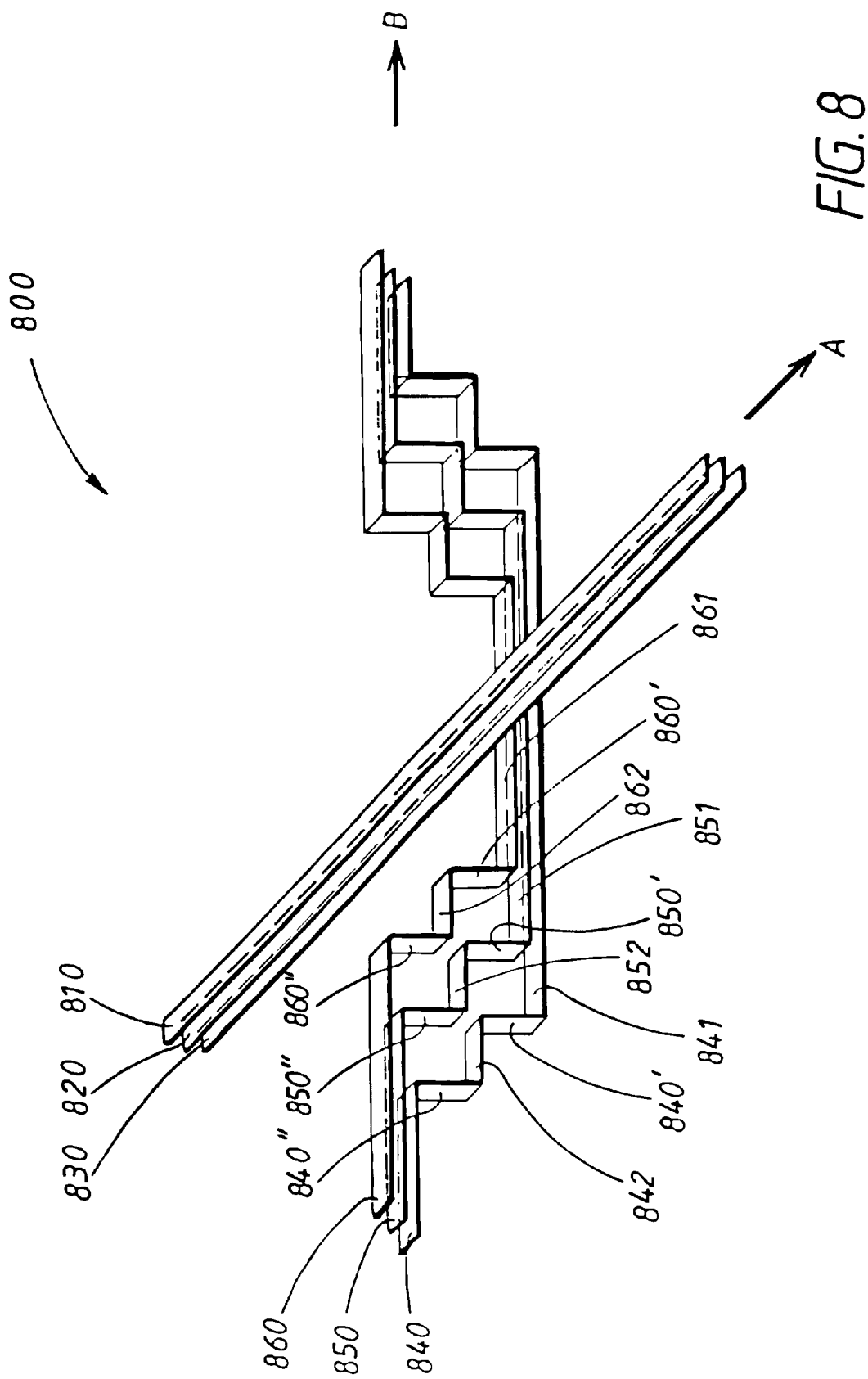

Embodiment 700 of the invention provides a good operation in many applications, but in certain applications, the "step" (connections 740', 750', 760') between the two planes of the strip-line conductors can be so large that it gives rise to unwanted losses and interference. One way of producing the same length in the steps with reduced losses and interference in such applications is to replace the "step" in embodiment 700 with two separate "steps". Such an embodiment 800 is shown in FIG. 8.

The transmission arrangement 800 is constructed according to the same principles as the embodiment 700, i.e., a first stripline conductor 820 with upper and lower ground planes 810 and 830, respectively, with the difference that the stepped form according to the invention has been used for allowing the second strip-line conductor also have a part of its extension 842, 852, 862 in a fourth plane. This extension in a fourth plane is situated between the extensions of the strip-line conductor in the second and the third plane. In this embodiment, the second strip-line conductor also exhibits electrical connections between adjacent planes, in the case shown, electrical connections 840", 850", 860" between the second and the fourth plane, and electrical connections 840', 850', 860' between the third and the fourth plane. The connections 840', 850', 860' and 840", 850", 860" connect the conductors of the second strip-line conductor, upper ground plane and lower ground plane in the respective second planes 850, 860, 840 and in the respective third planes 841, 851, 861 to the corresponding components of the second strip-line conductors in the fourth plane 842, 852, 862.

Figure 9:
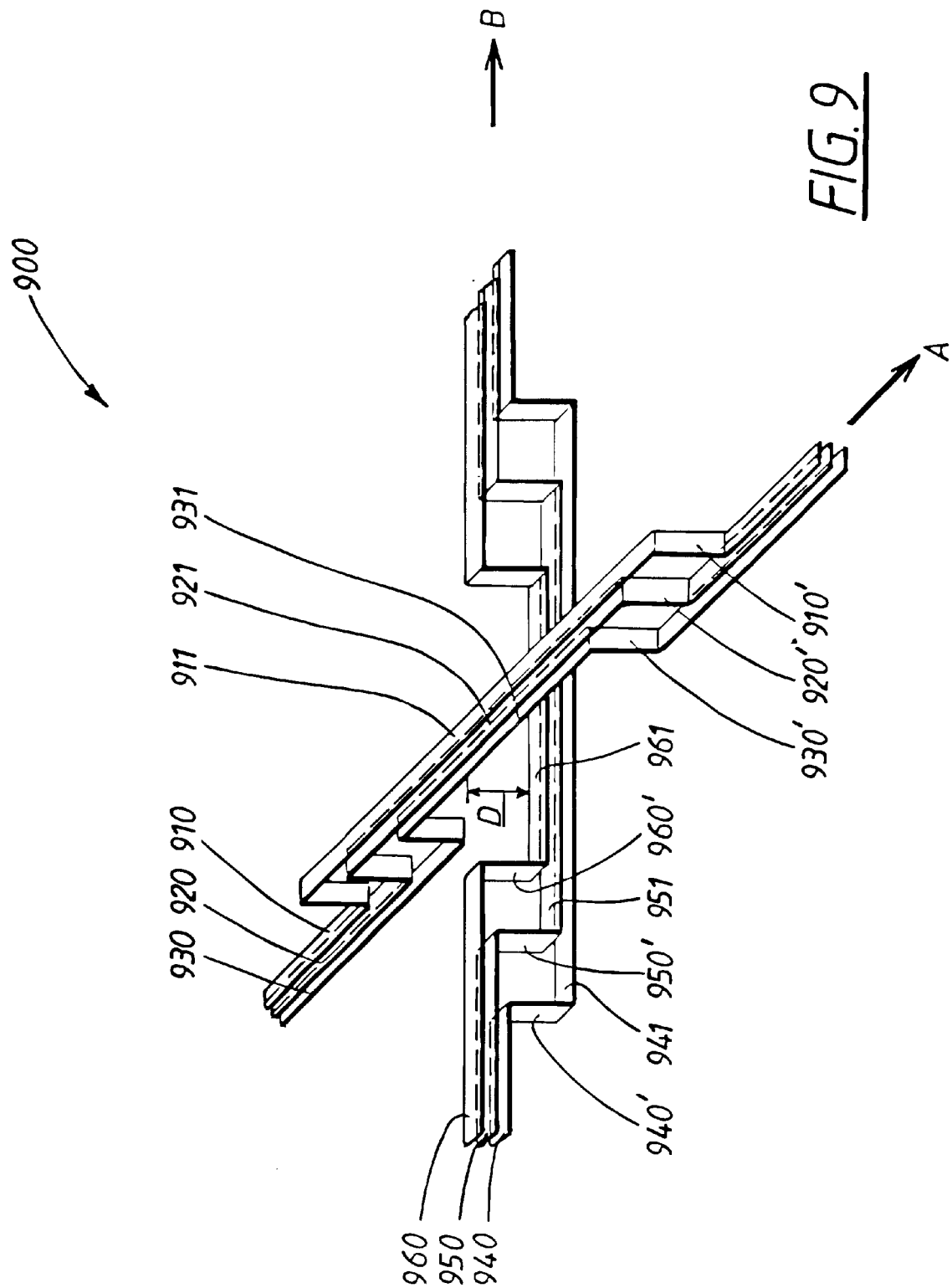
FIG. 9 shows an alternative embodiment of the invention which is used for allowing two strip-line conductors to cross each other's direction of extension.

An alternative way of using the stepped form according to the invention for increasing the insulation and reducing interference between crossing strip-line conductors is shown in FIG. 9. The transmission arrangement 900 shown in FIG. 9 comprises, like the arrangements 700 and 800, a first strip-line conductor which has its main extension in a first direction A in a first plane in the transmission arrangement 900 and which comprises a conductor 920, an upper ground plane 910 which is situated at an upper distance from the conductor and a lower ground plane 930 which is situated at a lower distance from the conductor, and a second strip-line conductor which has its main extension in a second direction B in a second plane in the transmission arrangement and which comprises a conductor 950, an upper ground plane 960 which is situated at an upper distance from the conductor and a lower ground plane 940 which is situated at a lower distance from the conductor. The ground planes are separated from their respective conductors and from one another by a dielectric material (not shown) in the arrangement 900.

Like the arrangements 700 and 800, the main direction of extension A of the first strip-line conductor in the arrangement 900 crosses the main direction of extension B of the second strip-line conductor at at least one point. The difference between the arrangement 900 and the arrangements 700 and 800 is that both the first and the second strip-line conductors are given a "step" in the crossing, but in different directions. This is achieved by the first strip-line conductor extending in a third plane in the transmission arrangement, and the second strip-line conductor extending in a fourth plane in the transmission arrangement, at the crossing point.

The first strip-line conductor exhibits electrical connections 910', 920', 930' between the first and the third plane, and the second strip-line conductor exhibits electrical connections 940', 950', 960' between the second and the fourth plane, where the connections 910', 920', 930'; 940', 950', 960' connect the conductor 920 of the first strip-line conductor, upper ground plane 910 and lower ground plane 930 in the first plane to its corresponding components 921, 931, 911 in the third plane, and the conductor 950 of the second strip-line conductor, upper ground plane 960 and lower ground plane 940 in the second plane to its corresponding components 951, 961, 941 in the fourth plane.

The third and the fourth plane are situated in the transmission arrangement in such a manner that the perpendicular distance D between the lower ground plane 930 of the first strip-line conductor and the upper ground plane 960 of the second strip-line conductor increases at the crossing point. In this way, a crossing between two strip-line conductors which has high insulation and relatively little interference is produced, at the same time as the arrangement 900 can be constructed in a compact and space-saving way.

The invention is not limited to the above embodiments, but can be freely varied within the scope of the patent claims following.

What is claimed is:

1. Electrical transmission line arrangement comprising first strip-line conductor which has a main extension in a first direction in a first plane in the transmission arrangement and comprises a first straight line conductor contained in the first plane, a first upper ground plane which is situated at an upper distance from the first conductor and a first lower ground plane which is situated at a lower distance from the first conductor, and a second strip-line conductor which has a main extension in a second direction in a second plane in the transmission line arrangement and comprises a second conductor having a first portion contained in the second plane and second portions contained in a third plane parallel to the second plane, a second upper ground plane which is situated at an upper distance from the second conductor portions and a second lower ground plane which is situated at a lower distance from the second conductor portion, where the respective ground planes are separated from corresponding conductors and from one another by a dielectric material, wherein the first lower ground plane of the first strip-line conductor coincides with the second upper plane of the second strip-line conductor, the main direction of extension of the first strip-line conductor crosses the main direction of extension of the second strip-line conductor, and wherein the second strip-line conductor includes electrical connections that connect the first and second portions of the conductor of the second strip-line conductor, the second upper ground plane, and the second lower ground plane.

2. Transmission line arrangement according to claim 1, in which the second strip-line conductor also include third and fourth portion in a fourth plane, and the electrical connections include electrical connections between the first and second portions.

3. Transmission line arrangement according to claim 1, in which all ground planes and conductors are designed in such a manner that all points on all conductors exhibit essentially the same capacitance with respect to corresponding ground planes.

4. Transmission line arrangement according to claim 1, in which at least one of the connections between different plane of the conductor of a strip-line conductor passes an edge in a ground plane.

5. Transmission line arrangement according to claim 4, in which said edge has an elliptical shape.

6. Transmission line arrangement according to claim 1, in which the distance between each of the first and second strip-line conductors and corresponding ground planes is essentially the same for the entire strip-line conductor.

* * * * *